(12) United States Patent
Kang

(10) Patent No.: US 8,067,311 B2
(45) Date of Patent: Nov. 29, 2011

(54) MASK AND METHOD FOR FABRICATING SEMICONDUCTOR DEVICE USING THE SAME

(75) Inventor: Jae-Hyun Kang, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 99 days.

(21) Appl. No.: 12/544,043

(22) Filed: Aug. 19, 2009

(65) Prior Publication Data
US 2010/0055900 A1   Mar. 4, 2010

(30) Foreign Application Priority Data
Sep. 2, 2008  (KR) .................. 10-2008-0086370

(51) Int. Cl.
*H01L 21/44* (2006.01)
(52) U.S. Cl. ............... 438/669; 257/E21.294; 430/5
(58) Field of Classification Search .......... 438/669; 257/E21.294; 430/5
See application file for complete search history.

(56) References Cited

U.S. PATENT DOCUMENTS

| | | | |
|---|---|---|---|
| 7,691,738 B2 * | 4/2010 | Lee ................... | 438/634 |
| 2002/0058401 A1 * | 5/2002 | Kim .................. | 438/571 |
| 2005/0112957 A1 * | 5/2005 | Yang et al. ........... | 439/758 |
| 2008/0090159 A1 * | 4/2008 | Yoshikawa et al. ...... | 430/5 |
| 2009/0108454 A1 * | 4/2009 | Lee ................... | 257/758 |
| 2010/0003823 A1 * | 1/2010 | Chen et al. ........... | 438/701 |
| 2010/0136781 A1 * | 6/2010 | Kulkarni et al. ....... | 438/622 |

FOREIGN PATENT DOCUMENTS
KR   10-2002-0054642   7/2002
KR   10-2003-0066999   8/2003
* cited by examiner

*Primary Examiner* — Angel Roman
*Assistant Examiner* — Stanetta Isaac
(74) *Attorney, Agent, or Firm* — Sherr & Vaughn, PLLC

(57) ABSTRACT

A mask for forming a metal line and a via contact, and a method for fabricating a semiconductor device using the same, minimizes misalignment. The mask includes a first mask region having a dark tone for light shading, a second mask region having a halftone, being disposed within the first mask region to form the metal line, and a third mask region having a clear tone, being disposed within the second mask region to form the via contact.

6 Claims, 8 Drawing Sheets

MASK AND METHOD FOR FABRICATING SEMICONDUCTOR DEVICE USING THE SAME

The present application claims priority under 35 U.S.C. 119 to Korean Patent Application No. 10-2008-0086370 (filed on Sep. 2, 2008), which is hereby incorporated by reference in its entirety.

BACKGROUND

Generally, two masks are used to form a metal line and a via contact in a semiconductor device as shown in FIG. 1A and FIG. 1B. FIG. 1A shows a phase shifting mask (PSM) having about 6% transmittance to form the metal line, according to a related art. FIG. 1B shows a PSM having about 6% transmittance to form the via contact, according to a related art.

FIG. 2A and FIG. 2B are sectional views showing the processes of forming the metal line and the via contact according to a related art. As shown in FIG. 2A, a metal layer 20 made from aluminum or copper is vapor-deposited over a wafer 10. A first photoresist film of a positive tone is applied over the metal layer 20. After that, exposure and developing are performed using the PSM of FIG. 1A, thereby patterning the first photoresist film. In this way, a first photoresist pattern 30 may be formed over the position for forming a metal line.

As shown in FIG. 2B, the metal layer 20 is etched by using the first photoresist pattern 30 over the metal layer 20 as a mask. Accordingly, a metal line 20a is formed over the wafer 10. The first photoresist pattern is then removed. In FIG. 2C, next, an insulating layer 40 such as a tetra ethyl ortho silicate (TEOS) is vapor-deposited over the whole surface of the wafer 10.

In FIG. 2D, next, a second photoresist layer of a positive tone is applied over the insulating layer 40. The second photoresist layer is patterned by performing exposure and developing using the PSM of FIG. 1B, thereby forming a second photoresist pattern over the position to form a via hole. Next, the insulating layer 40 is etched using the second photoresist pattern over the insulating layer 40 as a mask, thereby forming a via hole 50. The second photoresist pattern is then removed. In FIG. 2E, next, a via contact 60 is formed by embedding metal such as aluminum or copper in the via hole 50.

As described above, different PSMs are used in forming the metal line 20a and the via hole 50, respectively, which may induce misalignment between the metal line 20a and the via hole 50 as shown in a section A of FIG. 2D. Such misalignment may affect the resistance characteristics of the device. Without a margin between the metal line 20a and the via hole 50 considered in the design rule, the resistance characteristics may be seriously deteriorated. However, possibility of the misalignment is inevitable according to the related-art method which uses different masks for the metal line 20a and the via hole 50, and accordingly a solution to this issue has been required.

SUMMARY

Embodiments relate to a semiconductor technology, and more particularly, to a mask appropriate for producing a metal line and a via contact simultaneously and a method for fabricating a semiconductor device using the same. Embodiments relate to a mask capable of removing the possibility of misalignment between a metal line and a via contact, and a method for fabricating a semiconductor device using the same.

Embodiments relate to a mask for a semiconductor device which may include a first mask region for shading light, a second mask region disposed within the first mask region to form a metal line, and a third mask region disposed within the second mask region to form a via contact.

The first mask region may be a dark tone region, the second mask region may be a half tone region, and the third mask region may be a clear tone region. The first and the second mask regions may be formed of Cr. The second mask region may have about 20~30% transmittance. The second mask region may be a phase shifting mask (PSM).

Embodiments relate to a method for fabricating a semiconductor device, which may include forming a metal layer over a wafer, applying a photoresist layer over the metal layer, forming a photoresist pattern to form a metal line and a via contact by patterning the photoresist layer using a first mask region for shading light, a second mask region disposed within the first mask region to form the metal line, and a third mask region disposed within the second mask region to form the via contact, and forming the metal line and the via contact simultaneously by patterning the metal layer using the photoresist pattern.

A photoresist material of a negative tone may be applied over the metal layer, thereby forming the photoresist layer. The first mask region may be a dark tone region.

DRAWINGS

Figure 3A:
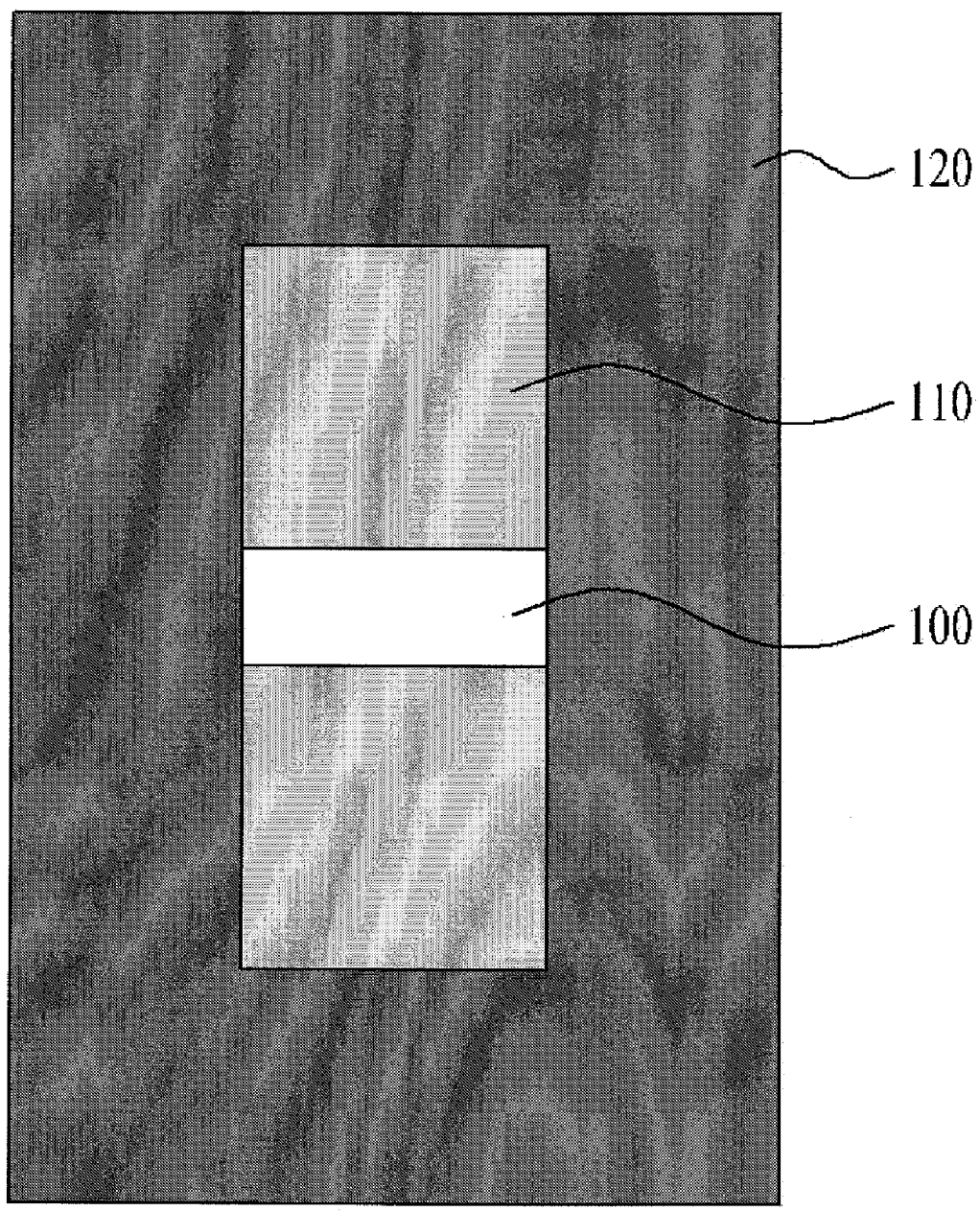
Figure 3B:
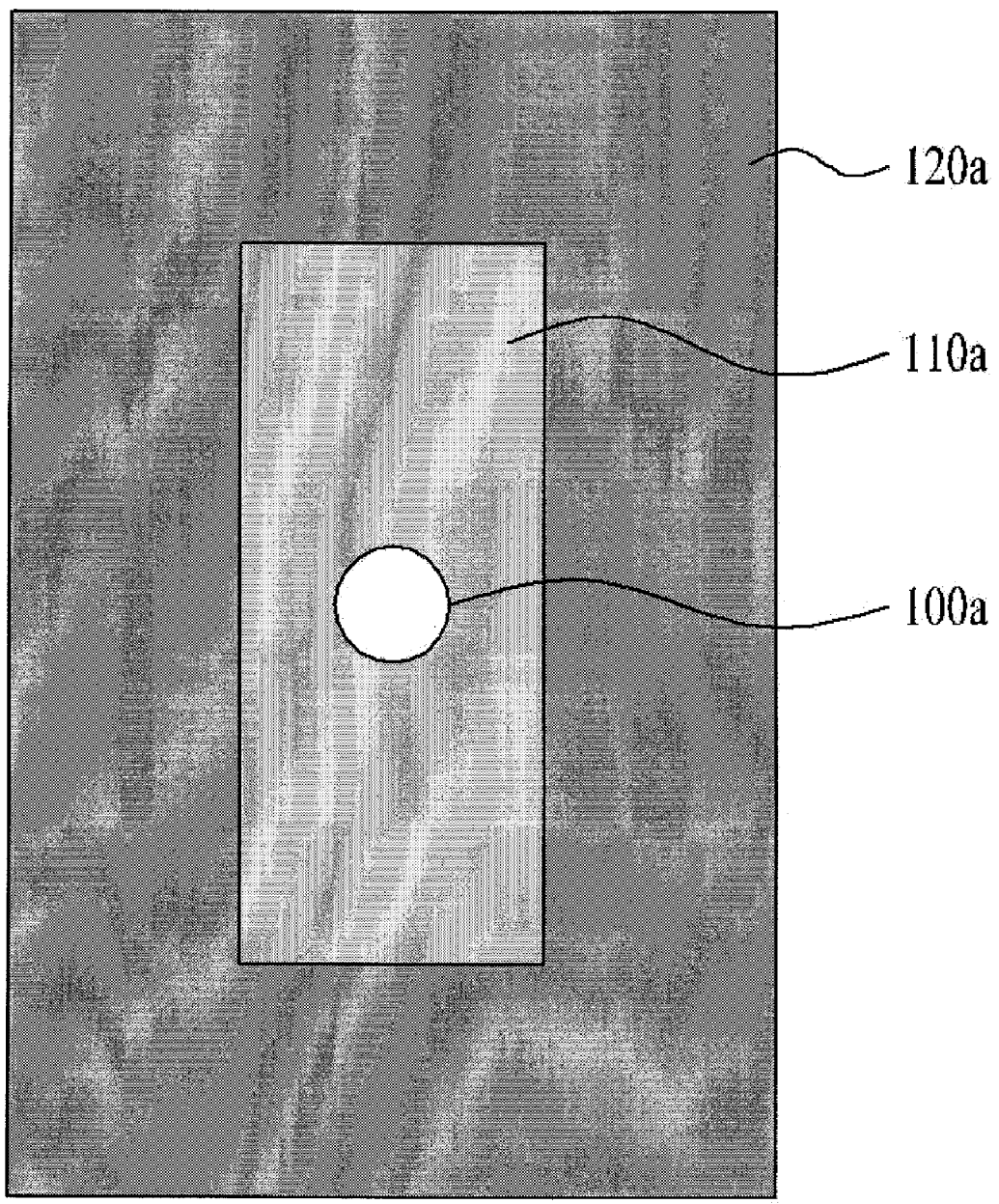

Example FIG. 3A and example FIG. 3B show a mask for simultaneously forming a metal line and a via contact, according to embodiments.

Figure 4A:
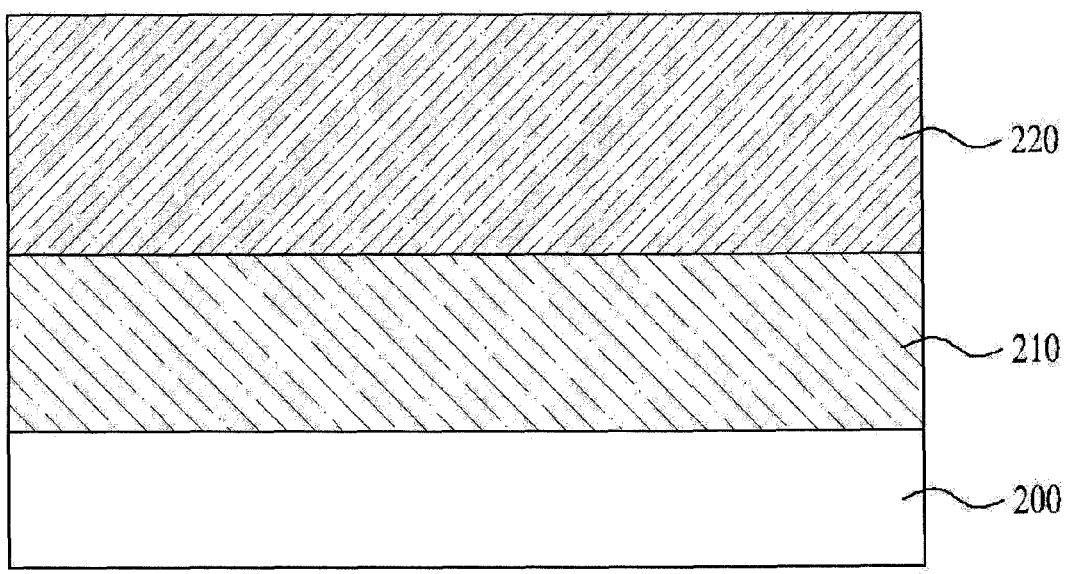
Figure 4B:
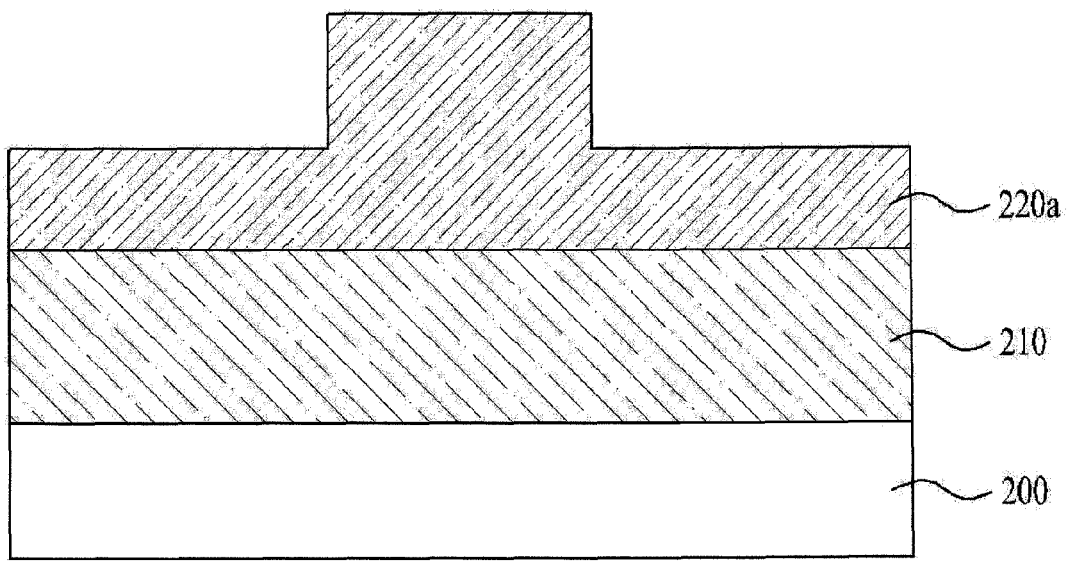
Figure 4C:
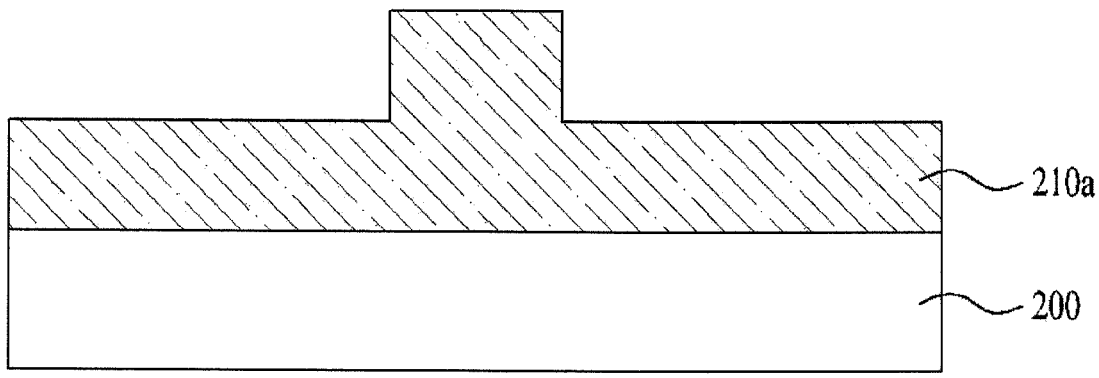

Example FIG. 4A to FIG. 4C are sectional views showing the processes of forming the metal line and the via contact, according to embodiments.

DESCRIPTION

Hereinafter, a mask and a semiconductor device fabricating method using the same will be described in detail with reference to the drawings. In a semiconductor device according to embodiments, a metal line and a via contact may be formed using one mask shown in example FIGS. 3A and 3B. That is, example FIGS. 3A and 3B show the mask for simultaneously forming the metal line and the via contact. More specifically, example FIG. 3A shows the basic structure of the mask whereas example FIG. 3B shows the mask to be actually applied to the processes of example FIGS. 4A to FIG. 4C.

Referring to example FIG. 3A, the mask may include three regions having different transmittances. A first mask region 120 may have a dark tone for light shading with about 0% transmittance. A second mask region 110 may have a half tone with about 20~30% transmittance. A third mask region 100 may have a clear tone of about 100% transmittance.

The mask shown in example FIG. 3B also includes three mask regions. A first mask region 120a may have a dark tone for light shading with about 0% transmittance. A second mask region 110a may have a half tone with about 20~30% transmittance for forming a metal line. A third mask region 100 may have a clear tone of about 100% transmittance for forming a via contact.

Here, the second mask regions 110 and 110a may be disposed within the first mask regions 120 and 120a, respectively. The third mask regions 100 and 100a may be disposed within the second mask regions 110 and 110a, respectively.

Chrome (Cr) may be used for both the first mask regions 120 and 120a and the second mask regions 110 and 110a. However, the first mask regions 120 and 120a are formed to perfectly shade light, whereas the second mask regions 110 and 110a are formed to have about 20~30% transmittance. In addition, the second mask regions 110 and 110a may have properties of a phase shifting mask (PSM).

Figure 1A:
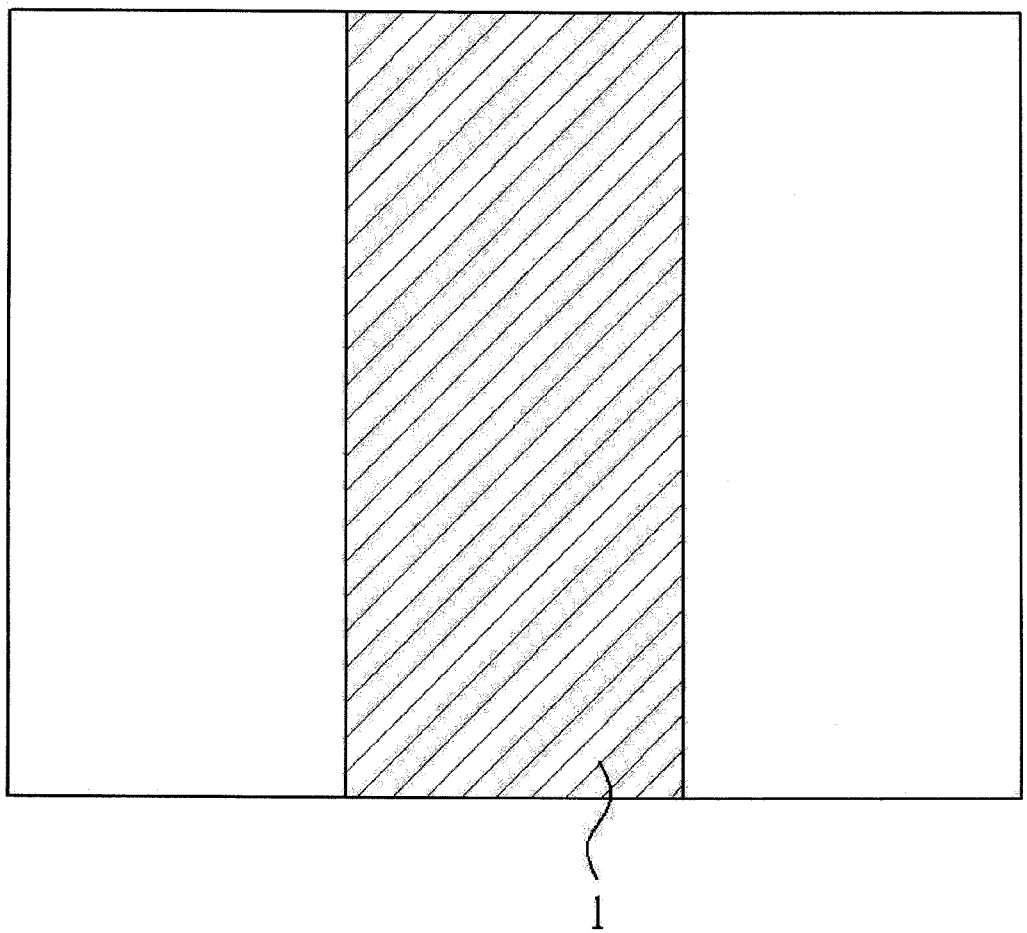
FIG. 1A shows a phase shifting mask (PSM) for forming a metal line according to a related art.
Figure 1B:
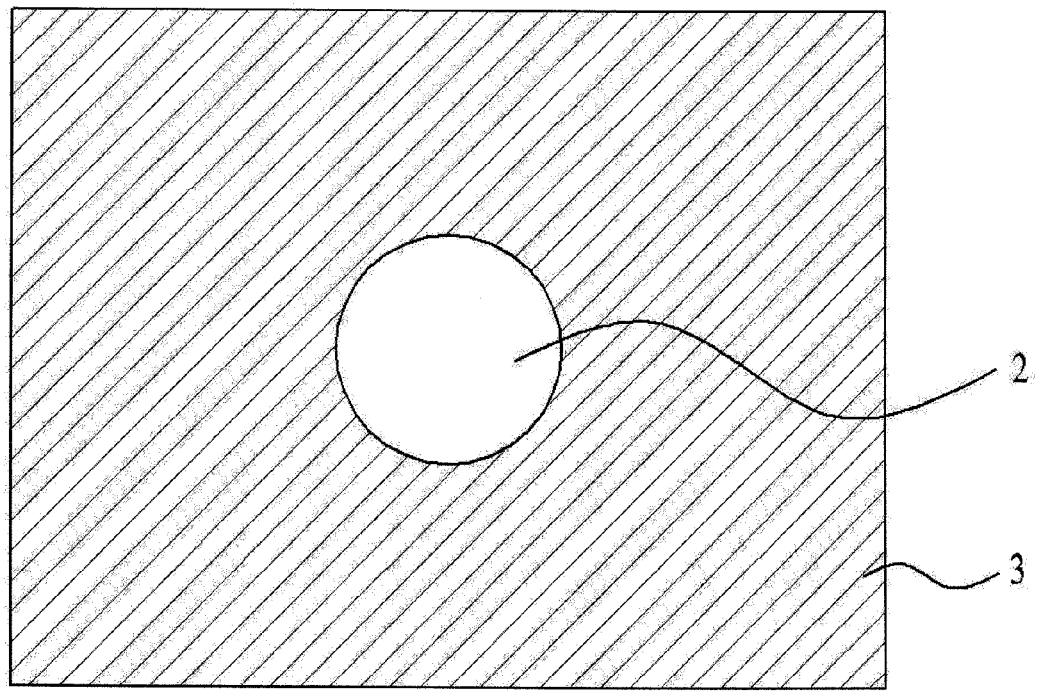
FIG. 1B shows a PSM for forming a via contact according to the related art.
Figure 2A:
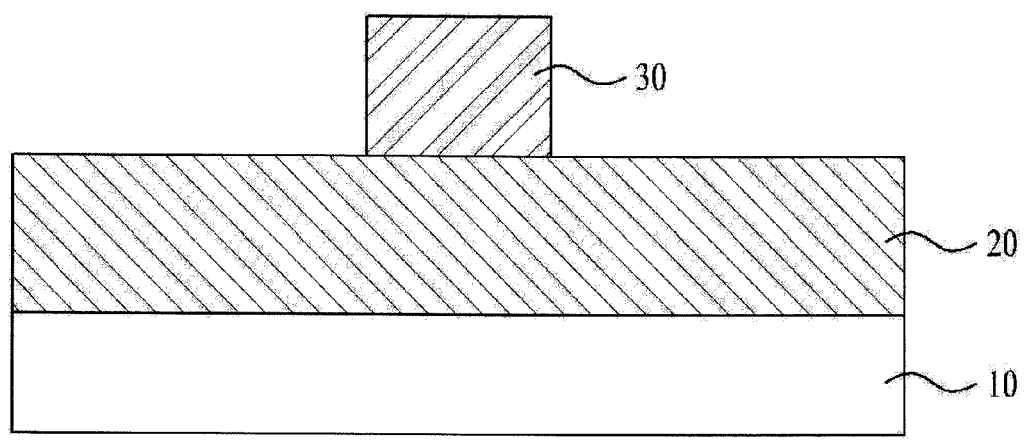
FIG. 2A to FIG. 2E are sectional views showing related-art processes of forming the metal line and the via contact.
Figure 2B:
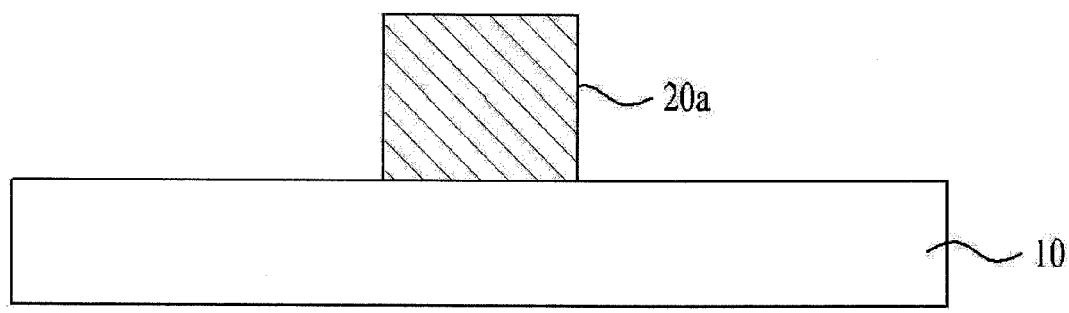
Figure 2C:
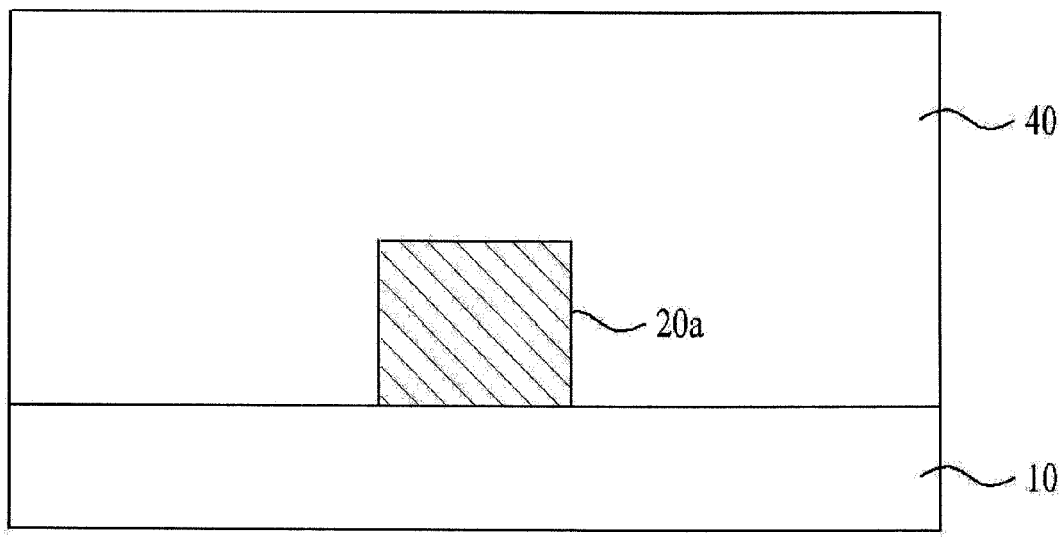
Figure 2D:
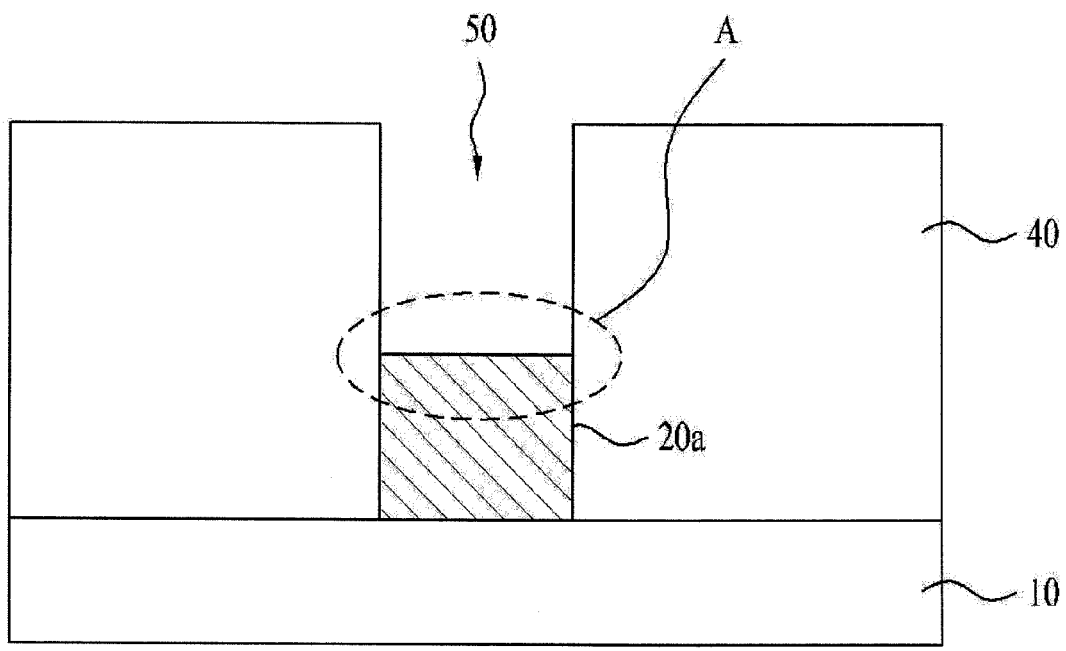
Figure 2E:
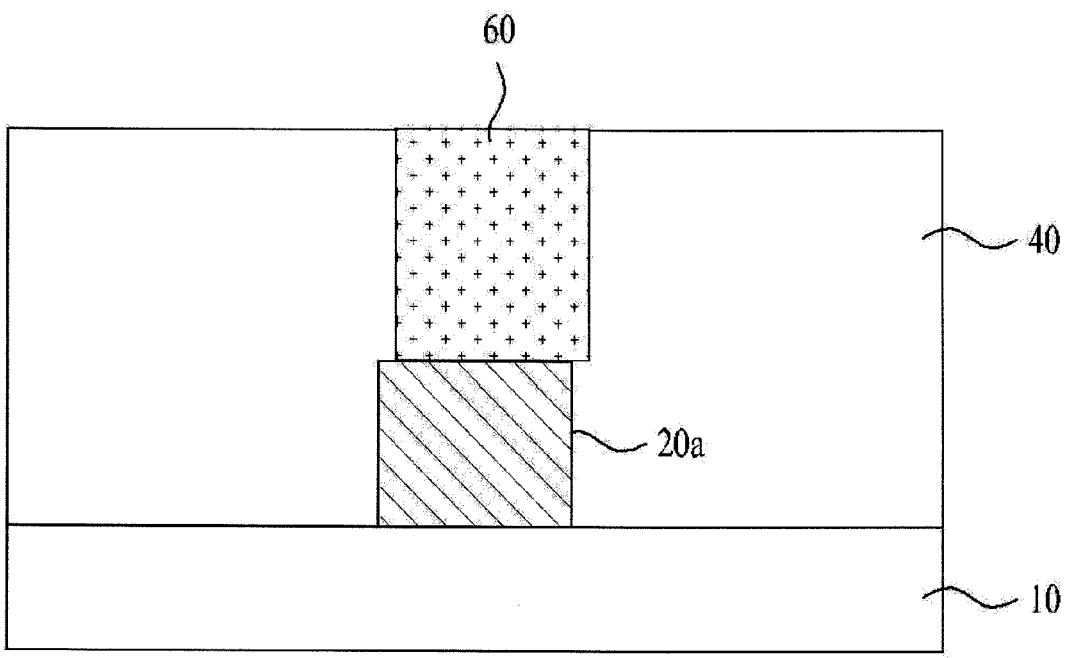

The single mask shown in example FIG. 3A or example FIG. 3B has an overlapping form of the two masks shown in FIGS. 1A and 1B. A single mask, therefore, is capable of forming the metal line and the via contact simultaneously. In particular, it may be unnecessary to use a separate, dedicated process to form a via hole. When using the mask shown in example FIG. 3A or example FIG. 3B, the intensity of light transmitting through the mask may be different between the position for forming the via contact and the position for forming the metal line, due to difference of the light transmittance.

Example FIG. 4A to FIG. 4C are sectional views illustrating the processes of forming the metal line and the via contact according to embodiments. Referring to example FIG. 4A, a metal layer 210 such as aluminum or copper may be vapor-deposited over a wafer 200. A photoresist layer 220 of a negative tone may be applied over the metal layer 210. Here, the metal layer 210 may be made thick enough to provide the thicknesses of both the metal line and the via contact.

Next, the photoresist layer 220 may be patterned by performing exposure and development using the mask of example FIG. 3B. Accordingly, a photoresist pattern 220a is formed to be stepped between the position for forming the metal line and the position for forming the via contact. When using the mask, the intensity of light passing through the mask may be greater at the position for the via contact than the position for the metal line. The photoresist pattern 220 may have a negative tone. Therefore, during patterning of the photoresist layer 220, the position for the metal line may be more etched than the position for the via contact, in correspondence with the ratio of transmittance.

Next, referring to example FIG. 4C, the metal layer 210 may be etched using the photoresist pattern 220a as a mask, thereby forming the metal line and the via contact simultaneously. After that, the used photoresist pattern 220a may be removed. A middle part in example FIG. 4C, which is thicker than the other part, corresponds to the via contact while a thinner part around the via contact corresponds to the metal line. Next, an insluting layer such as a tetra ethyl ortho silicate (TEOS) may be vapor-deposited over the whole surface of the wafer 200, including the metal line and the via contact.

As described above, a thick metal layer 210 can be etched using one mask. Accordingly the profiles for both the metal line and the via contact may be obtained simultaneously. While the related-art method requires a planarization process after embedding metal in the via hole, embodiments do not because a metal embedding process is omitted.

As apparent from the above description, in accordance with a mask and a method for fabricating a semiconductor device using the mask according to embodiments, a metal line and a via contact may be formed simultaneously using one mask. As a result, misalignment between the metal line and the via contact may be prevented, consequently improving the resistance characteristics of the device. In addition, by forming the metal line and the via contact through a single process, the whole process can be simplified and the cost can be reduced.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    forming a metal layer over a semiconductor wafer;
    applying a photoresist layer over the metal layer;
    forming a photoresist pattern to form a metal line and a via contact by patterning the photoresist layer using a first mask region for light shading, a second mask region disposed within the first mask region to form the metal line, and a third mask region disposed within the second mask region to form the via contact;
    forming the metal line and the via contact simultaneously by patterning the metal layer using the photoresist pattern; and
    vapor-depositing an insulating layer over the forming the metal line and the via contact, wherein the insulating layer is formed using a tetra ethyl ortho silicate.

2. The method of claim 1, wherein applying a photoresist layer over the metal layer includes applying a photoresist material of a negative tone over the metal layer.

3. The method of claim 1, wherein the first mask region is a dark tone region.

4. The method of claim 1, wherein the second mask region is a half tone region.

5. The method of claim 1, wherein the third mask region is a clear tone region.

6. The method of claim 1, wherein the second mask region has about 20~30% light transmittance.

* * * * *